(12) United States Patent
Kim et al.

(10) Patent No.: US 7,450,191 B2
(45) Date of Patent: Nov. 11, 2008

(54) METHOD AND APPARATUS FOR FABRICATING FLAT PANEL DISPLAY

(75) Inventors: Yong Bum Kim, Seoul (KR); Jin Wuk Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 437 days.

(21) Appl. No.: 11/019,539

(22) Filed: Dec. 23, 2004
(Under 37 CFR 1.47)

(65) Prior Publication Data

US 2005/0264710 A1    Dec. 1, 2005

(30) Foreign Application Priority Data

Dec. 27, 2003    (KR)    .................. 10-2003-0098128

(51) Int. Cl.
*G02F 1/136*    (2006.01)
(52) U.S. Cl. ..................................... 349/43
(58) Field of Classification Search .......... 349/43, 349/187
See application file for complete search history.

(56) References Cited

U.S. PATENT DOCUMENTS

| 6,517,995 | B1 | 2/2003 | Jacobson et al. | |
| 2005/0139576 | A1* | 6/2005 | Kim | 216/23 |
| 2006/0043626 | A1* | 3/2006 | Wu et al. | 264/101 |
| 2008/0017312 | A1* | 1/2008 | Kim | 156/345.3 |

* cited by examiner

*Primary Examiner*—James A Dudek
(74) *Attorney, Agent, or Firm*—McKenna Long & Aldridge LLP

(57) ABSTRACT

This invention relates to a flat panel display and a fabricating method thereof that are adaptive for conducting a patterning process without using a photo process to thereby reduce its process time and minimize pattern defects. A fabricating method and device of a flat panel display according to an embodiment of the present invention spreads an etch-resist on a thin film and forms an etch-resist pattern on a thin film by pressing a soft mold of a permeable structure to the etch-resist.

6 Claims, 12 Drawing Sheets

METHOD AND APPARATUS FOR FABRICATING FLAT PANEL DISPLAY

This application claims the benefit of Korean Patent Application No. P2003-98128 filed in Korea on Dec. 27, 2003, which is hereby incorporated by reference for all purposes as if fully set forth herein.

BACKGROUND OF THE INVENTION

1. Field of the Invention

The present invention relates to a flat panel display, and more particularly to a flat panel display and a fabricating method thereof that are adapted for conducting a patterning process without using a photo process, thereby reducing its process time and minimizing pattern defects.

2. Discussion of the Related Art

Display devices are becoming increasingly important for visual information communication. Cathode ray tubes (CRTs), or Braun tubes, which are popular display devices have problems of weight and large size.

A flat panel display that includes a liquid crystal display (LCD), a field emission display (FED), a plasma display panel (PDP), or an electro-luminescent (EL) display have also been commercialized.

The liquid crystal display has been replacing the CRT rapidly in various applied fields because it can satisfy the need for light weight, and thin physical profile.

In particular, an active matrix type liquid crystal display, which drives liquid crystal cells using a thin film transistor (hereinafter, referred to as "TFT"), has an advantage that its picture quality is good and its power consumption is low. TFT LCDs have been rapidly developed to larger sizes and higher resolutions due to improvements in mass production technology and the fruitful result of research and development.

The active matrix type liquid crystal display as illustrated in FIG. 1 includes a color filter substrate 22 and a TFT array substrate 23 bonded together with a liquid crystal layer 15 therebetween. The liquid crystal display illustrated in FIG. 1 represents part of the whole effective picture area.

The color filter substrate 22 includes a black matrix (not illustrated), a color filter 13 and a common electrode 14 on the rear surface of an upper glass substrate 12. A polarizer 11 is stuck to the front surface of the upper glass substrate 12. The color filter 13 inclusive of red (R), green (G) and blue (B) color filters transmits a visible ray of light in a specific wavelength range to enable color display.

In the TFT array substrate 23, data lines 19 and gate lines 18 cross each other on the front surface of a lower glass substrate 16. TFT's 20 are formed at these crossings. A pixel electrode 21 is formed at a cell area between the data line 19 and the gate line 18 on the front surface of the lower glass substrate 16. The TFT 20 responds to a scanning signal from the gate line 18 to switch a data transmission path between the data line 19 and the pixel electrode 21, thereby driving the pixel electrode 21. A polarizer 17 is attached to the rear surface of the TFT array substrate 23.

The liquid crystal layer 15 controls the amount of transmitted light incident through the TFT array substrate 23 by an electric field applied thereto.

The polarizers 11 and 17 attached to the color filter substrate 22 and the TFT substrate 23 transmit the light polarized in one direction. The polarizing directions thereof cross perpendicularly when the liquid crystal 15 is in a 90° TN mode.

An alignment film (not illustrated) is formed on the opposite surfaces of the liquid crystal of the color filter substrate 22 and the array TFT substrate 23.

A method for fabricating the active matrix type liquid crystal display is divided into, for example, a substrate cleaning process, a substrate patterning process, an alignment film forming/rubbing process, a substrate bonding/liquid crystal injecting process, a mounting process, an inspection process, and a repair process. The substrate cleaning process removes the impurities contaminating the substrate surface of the liquid crystal display with a cleansing solution. The substrate patterning process is divided into a patterning process of the color filter substrate and a patterning process of the TFT array substrate.

In the alignment film forming/rubbing process, the alignment film is spread over each of the color filter substrate and the TFT array substrate. The alignment film is rubbed with a rubbing cloth. In the substrate bonding/liquid crystal injecting process, the color filter substrate and the TFT array substrate are bonded and a liquid crystal and a spacer are injected through a liquid crystal injection hole. Then, the liquid crystal injection hole is sealed with a sealant.

The mounting process connects a tape carrier package (hereinafter, referred to as "TCP"), on which integrated circuits such as a gate drive integrated circuit and a data drive integrated circuit are mounted, with a pad part of the substrate. The drive integrated circuit may be directly mounted on the substrate by a chip on glass COG method in addition to a tape automated bonding method using the foregoing TCP. The inspection process includes an electrical test carried out after the pixel electrode and the signal lines such as the data line and the gate line are formed in the TFT array substrate; and an electrical test and a macrography carried out after the substrate bonding/liquid crystal injecting process. In the repair process, a restoration is carried out on the substrate judged to be possible to be repaired by the inspection process. In the inspection process, the un-repairable substrates are disposed as wastes.

In the fabricating method of most flat panel displays including the liquid crystal display, a thin film material deposited on the substrate is patterned in a photolithography process. The photolithography process is a series of photographic processes generally including the spread of photoresist, a mask aligning, an exposure, a development and a cleansing. However, the photolithography process has problems in that the time required for its completion is long, too much of the photo-resist material and the stripping solution are wasted, and it requires expensive equipment like exposure equipment.

SUMMARY OF THE INVENTION

Accordingly, the present invention is directed to a liquid crystal display device and method of manufacturing the same that substantially obviates one or more of the problems due to limitations and disadvantages of the related art.

It is an advantage of the present invention to provide a flat panel display that is adaptive for conducting a patterning process without using a photo process to thereby reduce its process time and minimize pattern defects.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other advantages of the invention, a fabricating method of a flat panel display according to an aspect of the present invention comprises: forming a soft mold as a permeable structure; spreading an etch-resist over a thin film; forming an etch-resist pattern on the thin film by pressing the soft mold to the etch-resist; separating the soft mold from the etch-resist pattern; and etching the thin film by using the etch-resist pattern as a mask.

In the fabricating method, the step of forming the soft mold includes: forming the permeable structure using a master mold; and forming a thin film resin layer on the surface of the permeable structure to stop a solvent flowing into the permeable structure and a rapid gas inflow.

In the fabricating method, the permeable structure has silica particles.

In the fabricating method, the thin film resin layer has at least one among polydimethylsiloxane, polyurethane and cross-linked novolac resin.

In the fabricating method, the thickness of the thin film resin layer is about 1 μm to 100 μm.

In the fabricating method, the flat panel display is any one of a liquid crystal display LCD, a field emission display FED, a plasma display panel PDP and an electro luminescence EL.

A fabricating device of a flat panel display according to another aspect of the present invention includes: a soft mold formed as a permeable structure; a spreading device to spread an etch-resist over a thin film; and a device to form an etch-resist pattern on the thin film by pressing the soft mold to the etch-resist, to separate the soft mold from the etch-resist pattern, and to etch the thin film by using the etch-resist pattern as a mask.

In the fabricating device, the soft mold includes: a thin film resin layer formed on the surface of the permeable structure to stop a solvent flowing into the permeable structure and a rapid gas inflow.

In the fabricating device, the permeable structure has silica particles.

In the fabricating device, the thin film resin layer has at least one among polydimethylsiloxane, polyurethane and cross-linked novolac resin.

In the fabricating device, the thickness of the thin film resin layer is about 1 μm to 100 μm.

In the fabricating device, the flat panel display is any one of a liquid crystal display LCD, a field emission display FED, a plasma display panel PDP and an electro luminescence EL.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
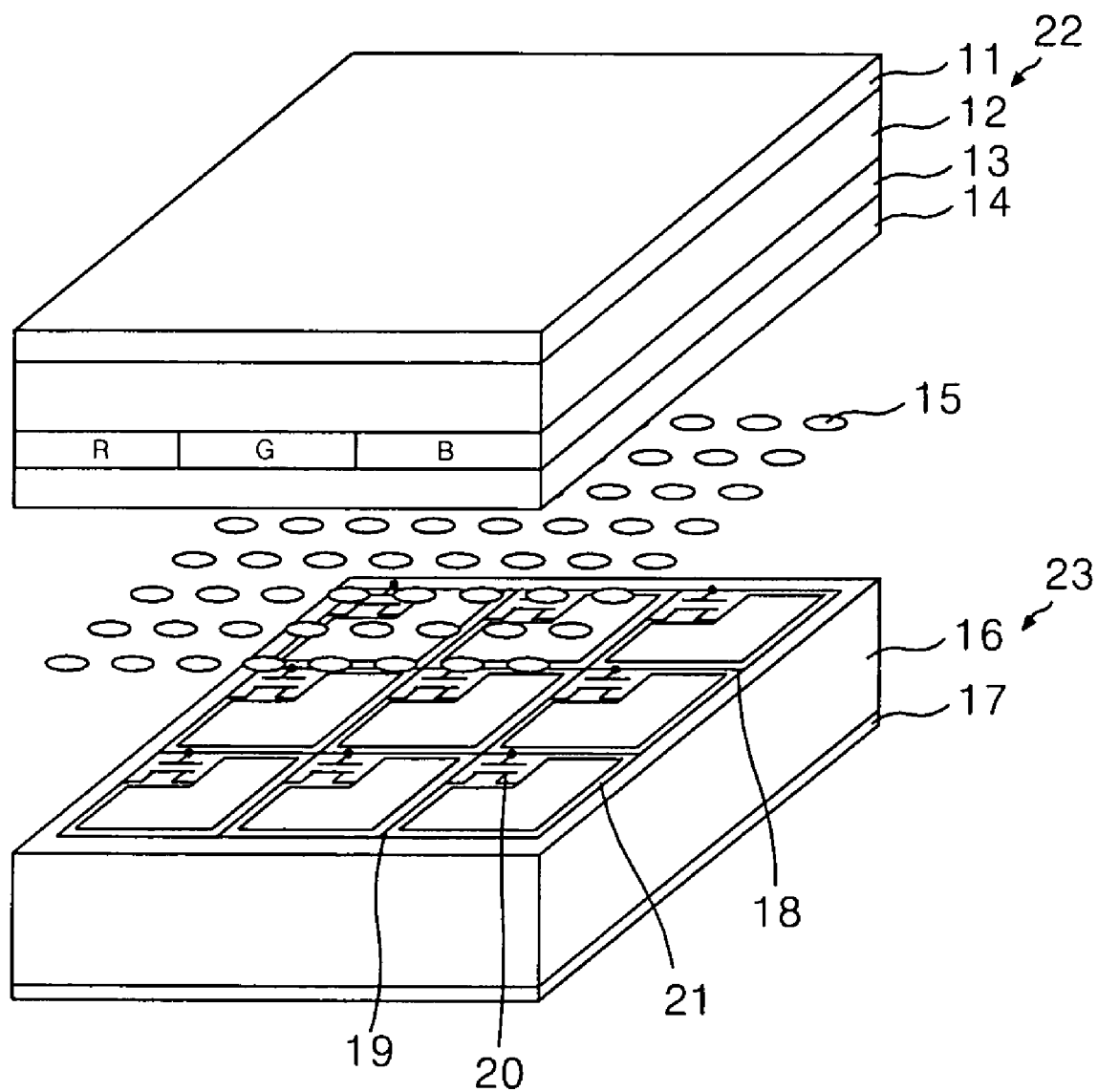
FIG. 1 is a perspective view illustrating an active matrix type liquid crystal display.
Figure 2:
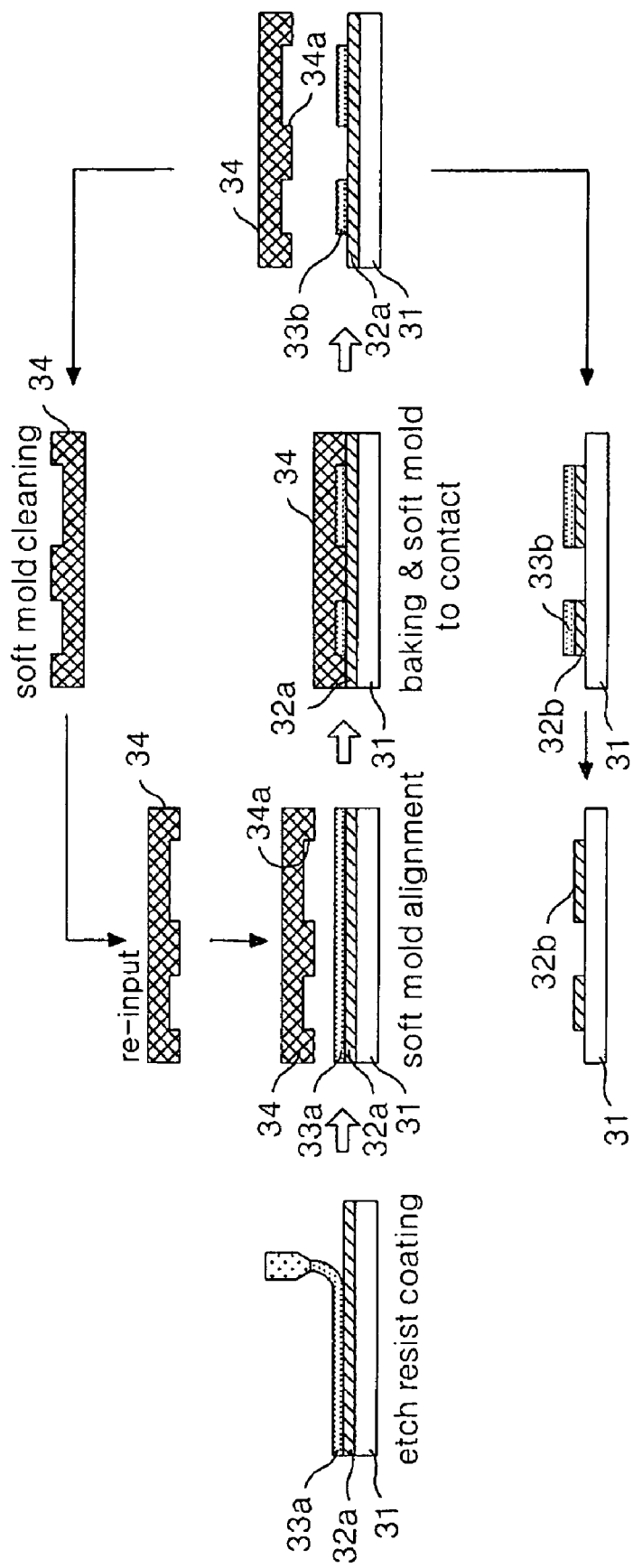
FIG. 2 is a diagram illustrating a fabricating method of a flat panel display according to an embodiment of the present invention.

Referring to FIG. 2, a fabricating method of a flat panel display according to an embodiment of the present invention includes: a spread process of an etch-resist solution 33A on a glass substrate 31 where a thin film 32 of a pixel array; a patterning process of the etch-resist solution 33A using a soft mold 34; an etching process for patterning the thin film 32A; a stripping process of the etch-resist pattern 33B; and an inspection process on a thin film pattern 32B.

The thin film 32A of the pixel array formed on the glass substrate 31 is formed of a basic material on the glass substrate 31 by the spreading process or depositing process understood in the art, wherein the basic material is used as a metal pattern, an organic pattern and an inorganic pattern in the pixel array of the flat panel display.

The etch-resist solution 33A might be a material having heat resistance and chemical resistance, e.g., a solution where a novolac resin is added to an ethanol solution by about 5% to 30% by weight. The etch-resist solution 33A is spread over the thin film 32A by the spreading process such as a nozzle spray, a spin coating and etc.

Figure 3:
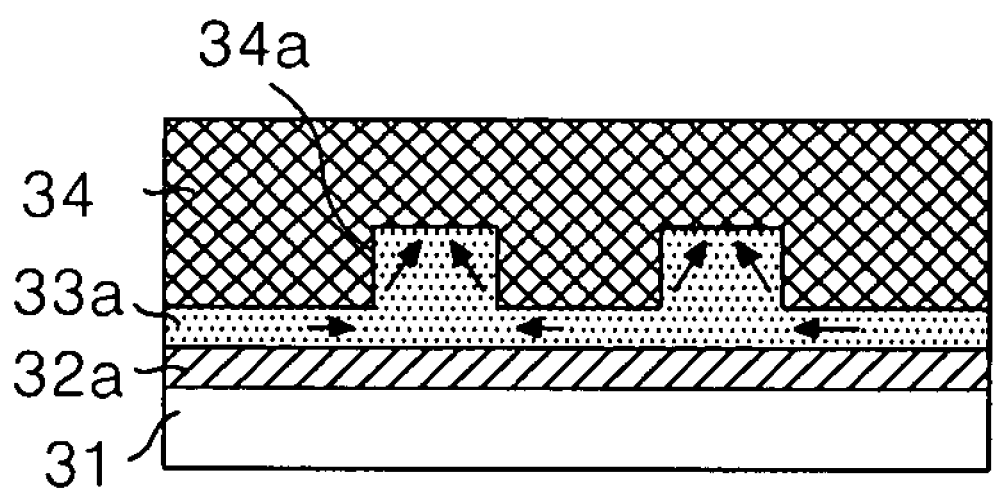
FIG. 3 is a diagram illustrating a movement of an etch-resist solution when the substrate contacts a soft mold illustrated in FIG. 2.

The soft mold 34 has a groove 34A formed, wherein the groove 34A corresponds to the pattern which is to be formed on the glass substrate 31. The soft mold 34 is aligned on the etch-resist solution 33A, and then applies pressure to the etch-resist solution 33A with only enough pressure for the solution to contact the thin film 32A. The pressure requirement may be satisfied by the weight of the soft mold 34. At the same time, the glass substrate 31 may be baked at the temperature of about 130° C. or below for 10 minutes to 2 hours. Then the etch-resist solution 33A, as illustrated in FIG. 3, moves into the groove 34A of the soft mold 34 by a capillary force generated by a pressure between the soft mold 34 and the glass substrate 31 and a repulsive force between the soft mold 34 and the etch-resist solution 32A.

As a result, the etch-resist pattern 33B is formed on the thin film 32A in a pattern shape where it is a reverse copy of the groove pattern of the soft mold 34.

After the soft mold 34 is separated from the glass substrate 31, a wet etching process or a dry etching process is carried out. At this moment, the etch-resist pattern 34B acts as a mask, so only the thin film 32A located at the lower part of the etch-resist pattern 34C remains on the glass substrate 31. The thin film 32A elsewhere is removed. Subsequently, the etch-resist pattern 34C is removed by the stripping process and an inspection such as the short circuit, broken wire and etc. of the thin film pattern 32B is carried out through an electrical and optical test on the thin film pattern 32B.

The soft mold 34, after being separated from the glass substrate 31, is cleansed with ultraviolet rays and ozone (O3) and then reused in the patterning process of another thin film 32A.

Figure 4:
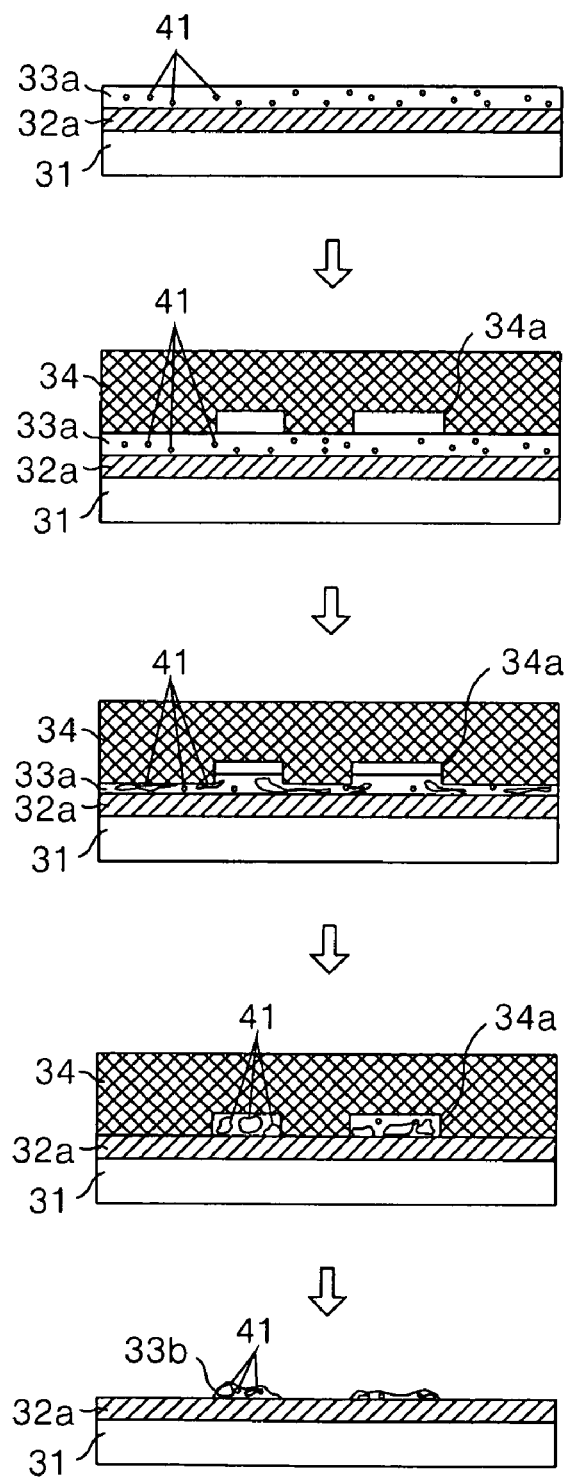
FIG. 4 is a sectional diagram illustrating a bubble generated during the course of a process of FIG. 2 and a pattern defect of an etch-resist generated because of the bubble.

On the other hand, bubbles may be generated within the etch-resist solution 33A by the external air flowing into the etch-resist solution 33A and an out-gassing generated by the volatile solvent within the etch-resist solution 33A in the patterning process of the etch resist. In other words, minute bubbles 41, as illustrated in FIG. 4, exist in the etch-resist solution 33A, and the air in the atmosphere is mixed in the etch-resist solution 33A when the soft mold 34 contacts the etch-resist solution 33A. The bubbles in the etch-resist solution 33A increases in the baking process and by the pressure applied to the soft mold 34, and the bubbles acts as a cause of depression or loss of the etch-resist pattern 33B.

The bubbles generated during the etch-resist pattern process remains within the etch-resist solution 33A and the etch-resist pattern 33B because the evaporation speed of a solvent in the etch-resist solution 33A is faster than that of the soft mold 34, which absorbs the solvent in the etch-resist solution 33A to solidify it. Thus, the bubbles cause pattern defects of the etch-resist pattern 33B.

If the thin film pattern 32B is a signal line, there may exists a undesired short circuit or open circuit due to the pattern defect of the etch-resist pattern 33B, thereby preventing a signal to be normally supplied to the display device.

In order to prevent pattern defects of the etch resist caused by the remaining bubbles, the method and device for fabricating the flat panel display according to the present invention has at least part of the soft mold 34 manufactured to have a porous structure where the absorption and discharge of the bubbles are possible. Herein, the porous structure might be a continuous bubble structure with a plurality of minute openings or structures that have a three-dimensional net structure having permeability.

FIGS. 5A to 5H represent step by step an embodiment of a fabricating method of a soft mold 34 according to the present invention.

Figure 5A:
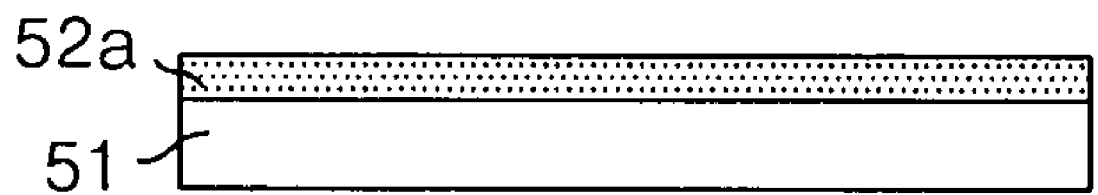
FIGS. 5A to 5H are sectional diagrams illustrating step by step a fabricating method of the soft mold illustrated in FIG. 2.
Figure 5B:
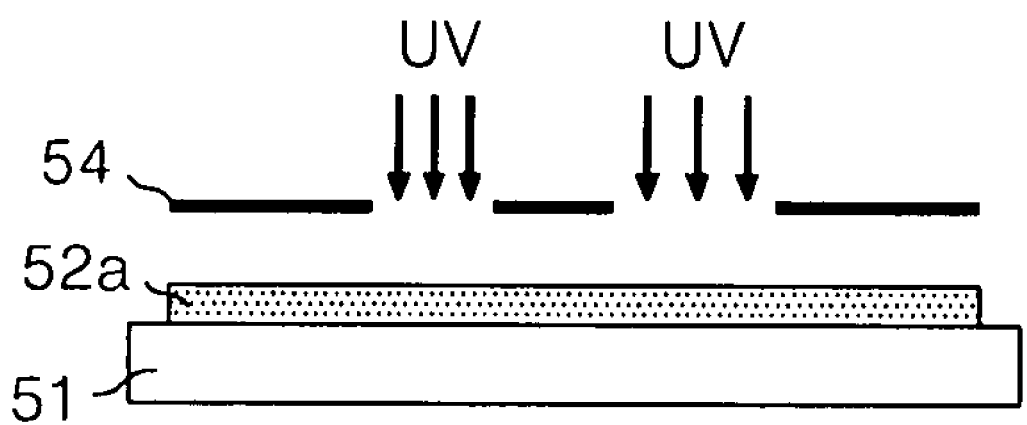

The fabricating method of a soft mold 34 according to an embodiment of the present invention spreads a photo-resist 52A over the entire surface of a master substrate 51 as illustrated in FIG. 5A. Subsequently, the present invention, as illustrated in FIG. 5B, aligns a photo mask 54 on the photo-resist 52A, illuminates ultraviolet ray UV onto the photo-resist 52A through the photo mask 54, and then forms a photo-resist pattern 52B through a development process. In this way, the master substrate 51 where the photo-resist pattern 52B is formed acts as a first master mold to form a porous resin structure.

Figure 5C:
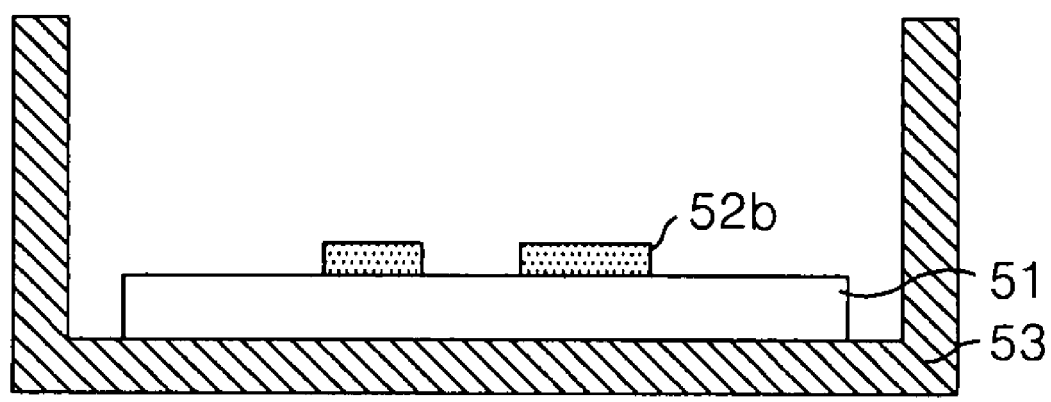
Figure 5D:
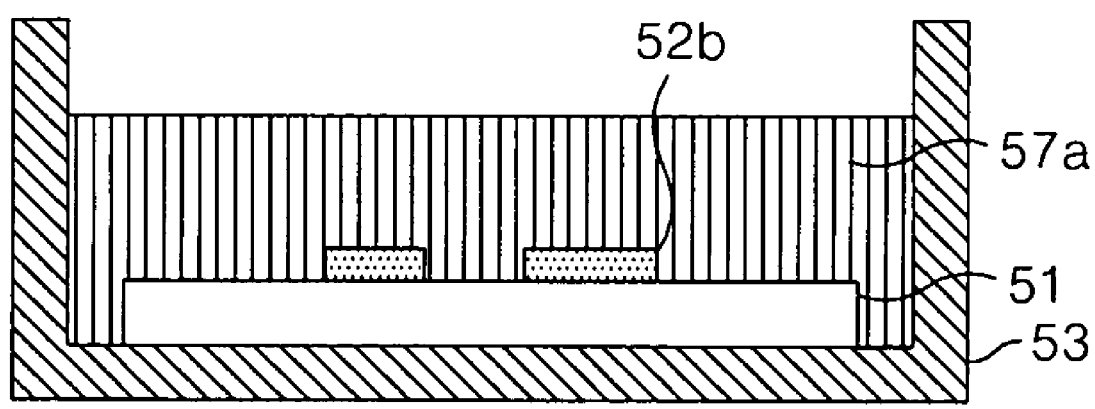
Figure 5E:
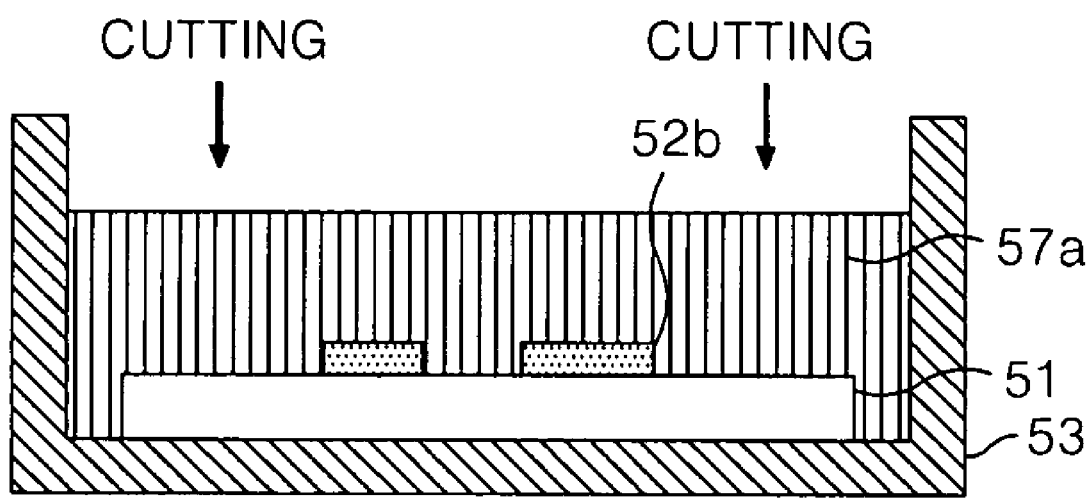

The first master mold made by the processes of FIGS. 5A and 5B is mounted within a first frame 53 as in FIG. 5C. The first frame 53 has a bottom surface onto which the first mask mold is put and a side wall of which the height is higher than that of the soft mold 34. As illustrated in FIG. 5D, when the first master mold is mounted, a solution 57A in which porous resin particles, e.g., silica particles, are uniformly mixed is injected into the first frame 53 and the porous resin solution is solidified through the baking process. The porous resin solution 57A solidified in this way, as illustrated in FIG. 5E, is cut to a designated size and separated from the first master mold.

Figure 5F:
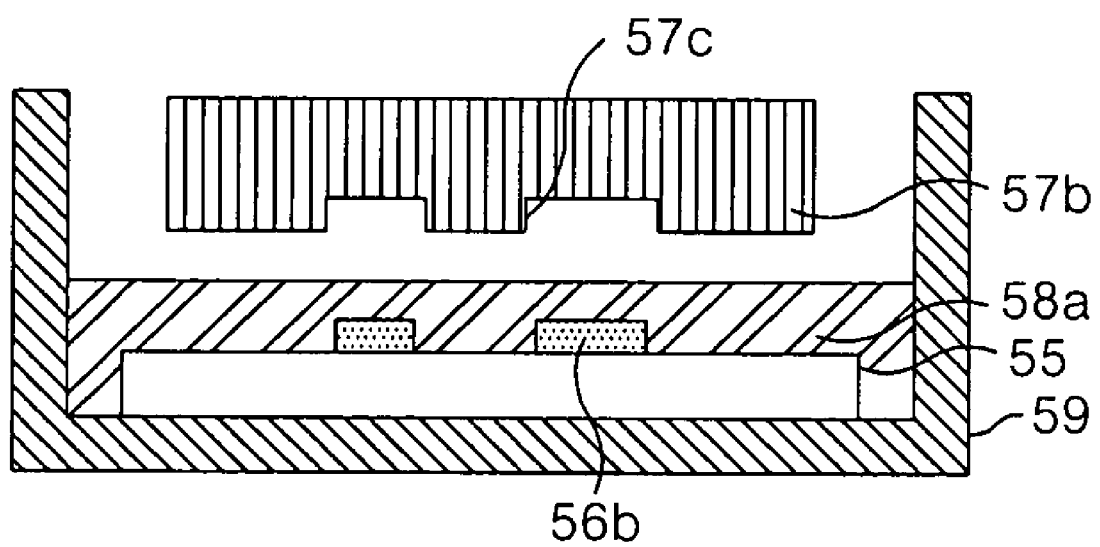
Figure 5G:
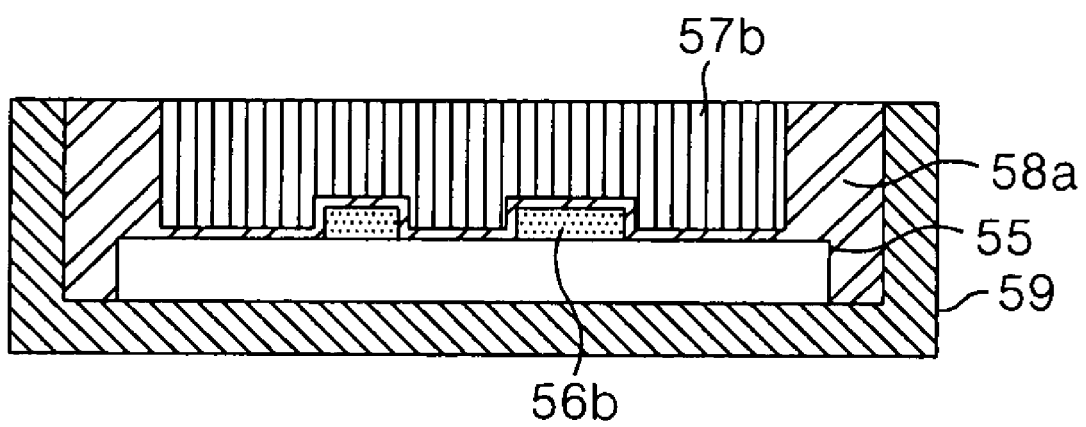

A porous resin structure 57B of FIG. 5F separated in the cutting process has an engraved pattern 57C which is reversely copied from the embossed pattern of the first master mold. A thin film resin layer is formed in the surface of the porous resin structure 57B where the engraved pattern 57C is formed. The thin film resin layer prevents the solvent of an etch-resist solution 33A from rapidly flowing into the porous resin structure and enables only a small amount of solvent molecule and the vaporized gas of the solvent to pass toward the porous resin structure in the contact, pressure applying and baking process of the soft mold and the etch-resist solution 33A. For this, a second master mold is mounted therein and a second frame 59 holding a thin film resin material solution 58A is provided, as illustrated in FIGS. 5F and 5G. Herein, the second master mold is made into a second master substrate 55 where there exists an embossed pattern 56B of which the size is smaller than the engraved pattern 57C of the porous resin structure 57B. The thin film resin material solution 58A includes a rubber material which is good when bonding with the porous resin structure 57B and has relatively high elasticity, e.g., polydimethysiloxane (PDMS), polyurethane and cross-linked novolac resin.

Referring to FIGS. 5F and 5G, the porous resin structure 57B is absorbed into the thin film resin material solution 58A in order for the embossed pattern 56B of the second master mold to be inserted into the engraved pattern 57C. When the porous resin structure 57B is being absorbed, the thin film resin material solution 58A is cured by the baking process.

Figure 5H:
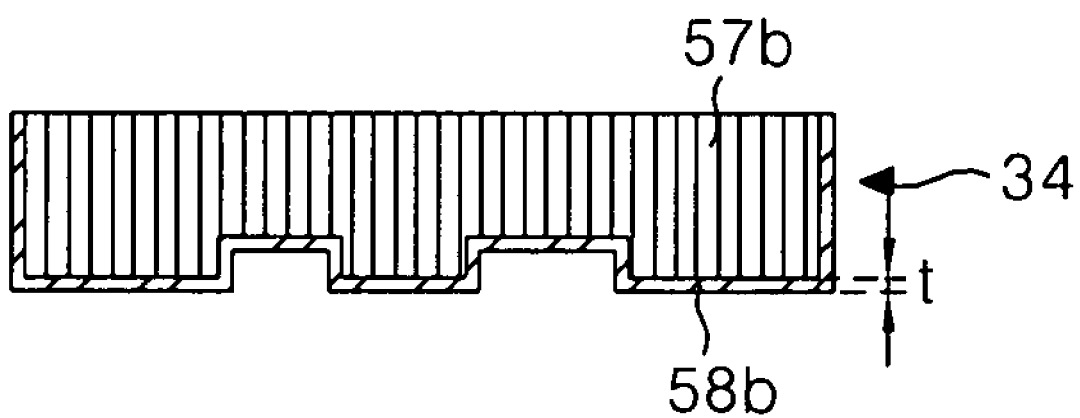

Lastly, the present invention, as illustrated in FIG. 5H, separates the porous resin structure 57B from the thin film resin material that is cured in order for the thin film resin layer 58B to remain at a designated thickness on the surface of the porous resin structure 57B inclusive of the engraved pattern 57C. In addition the porous resin structure 57B is dried for a designated time period to remove any remaining solvent that absorbed into the porous resin structure 57B.

The thickness (t) of the thin film resin layer 58B is about 1 μm to 100 μm. The thickness of the thin film resin layer 58B, as described above, is to satisfy the condition that prevents the solvent of an etch-resist solution 33A from rapidly flowing into the porous resin structure 57B and enables only a small amount of solvent molecule and the vaporized gas of the solvent to pass toward the porous resin structure 57B or only the vaporized gas of the solvent to pass toward the porous resin structure 57B.

On the other hand, the thin film resin material solution 58A may be dispensed on the porous resin structure 57B directly or spread over the porous resin structure 57B by a spin coating method as well as by a digestion method, as illustrated in FIGS. 5F and 5G.

The fabricating method and device of the flat panel display according to the present invention may be applied to a process that is for patterning the electrode layer, organic layer and inorganic layer of the flat panel display such as the liquid crystal display LCD, the field emission display (FED), the plasma display panel (PDP), or the electro-luminescent display (EL).

As described above, the fabricating method and device of the flat panel display according to the present invention can pattern the thin film of the display device without using the photo process using the soft mold and the etch-resist, and reduce its process time. Further, the fabricating method and device of the flat panel display according to the present invention gives permeability to the soft mold, allowing it to absorbs gas generated from the solvent of the etch-resist in the contact, pressure applying and baking process of the soft mold and the etch-resist and discharge that gas to the outside, thereby preventing any pattern defects in the thin film caused by the remaining bubbles of the etch-resist. In addition, it forms the thin film resin layer, which allows only a small amount of solvent molecule or the gas molecule generated by the evaporation of the solvent to pass through, in the contact surface of the soft mold and the etch-resist, thereby enabling to prevent the soft mold from being saturated with the solvent or swelled.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A fabricating method of a flat panel display, comprising:

forming a soft mold as a permeable structure;

spreading an etch-resist over a thin film;

forming an etch-resist pattern on the thin film by pressing the soft mold to the etch-resist;

separating the soft mold from the etch-resist pattern; and etching the thin film by using the etch-resist pattern as a mask, wherein, the soft mold is pressed onto the etch resist by its own weight.

2. The fabricating method according to claim 1, wherein the step of forming the soft mold comprises:

forming the permeable structure using a master mold; and forming a thin film resin layer on the surface of the permeable structure to stop a solvent flowing into the permeable structure and a rapid gas inflow.

3. The fabricating method according to claim 2, wherein the permeable structure has silica particles.

4. The fabricating method according to claim 2, wherein the thin film resin layer has at least one among polydimethylsiloxane, polyurethane and cross-linked novolac resin.

5. The fabricating method according to claim 1, wherein the thickness of the thin film resin layer is about 1 μm to 100 μm.

6. The fabricating method according to claim 1, wherein the flat panel display is any one of a liquid crystal display LCD, a field emission display FED, a plasma display panel PDP and an electro luminescence EL.

* * * * *